July 23, 1963 W. H. BUCHSBAUM 3,098,287

METHOD OF ASSEMBLING COMPONENTS ON PRINTED WIRING BOARDS

Filed July 22, 1958

United States Patent Office 3,098,287

Patented July 23, 1963

3,098,287

METHOD OF ASSEMBLING COMPONENTS ON PRINTED WIRING BOARDS

Walter H. Buchsbaum, Bellerose, N.Y., assignor to Hazeltine Research, Inc., Chicago, Ill., a corporation of Illinois Filed July 22, 1958, Ser. No. 750,192
1 Claim. (Cl. 29—155.5)

Figure 1:
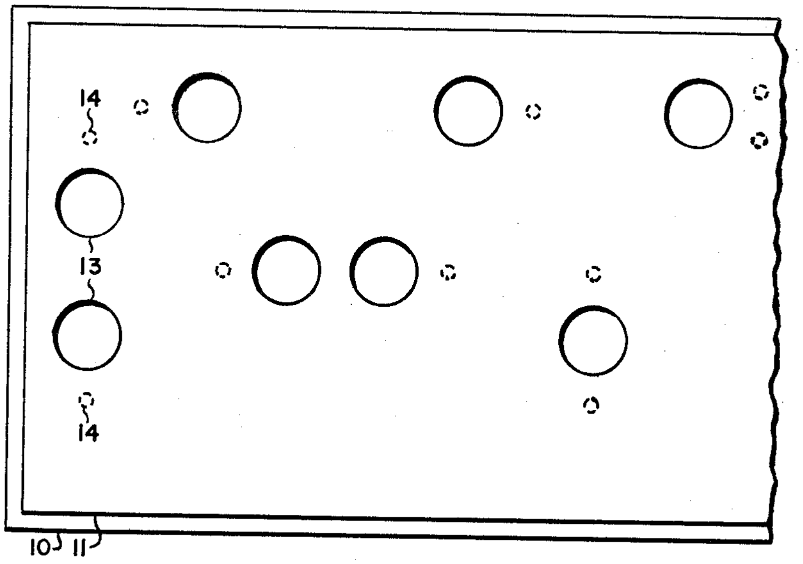

This invention relates to a method of assembling components on printed wiring boards with the components spaced away from the board that utilizes material placed between the components and the board during the mounting process.

In printed wiring assemblies it sometimes is desirable to maintain at least a minimum space between the mounted component and the board. This requirement might be dictated by a desire to coat the entire board, both around and under the components, with a material such as polyvinyl fluoride to protect the board from excess humidity during normal operation. One method of achieving this spacing is to use stakes on the component leads. These stakes are wedge-shaped metal lugs which are crimped onto the end of the component lead. The staked end of the lead is then forced into the circuit hole and by bending the lead at the appropriate point above the board a desired spacing from the board is achieved. A second method used is to bend or crimp the lead end so that the lead may be inserted only up to its altered portion, resulting in a spacing effect which is the same as when staked leads are used. However, these methods generally require excessive handling of the components and, in the case of subminiature components, the danger of damaging the components during the crimping operation is increased, making such methods economically unsound in practice. Another and, if possible, more simple solution to the problem becomes necessary. Such an alternative solution would be to insert a phenolic or paper spacer between the component and the board until after the mounting process is completed, whereupon the spacer would be removed. Such a method becomes impractical where complex wiring boards are used in which the components are placed without regard to symmetrical alignment. The complex board is becoming more widespread in its use, especially in the field of miniature and subminiature wiring board assemblies where it is important to realize the most efficient conservation of space and at the same time to avoid close proximity between adjacent connections.

It is an object of the present invention to provide a new and improved method of assembling spaced components on printed wiring boards which avoids the disadvantages and limitations of prior known methods.

It is another object of the present invention to provide a simple and inexpensive method of assembling spaced components on printed wiring boards which is adaptable to both manual and automatic operation.

It is a further object of the present invention to provide a method of assembling spaced components on printed wiring boards which eliminates the need for the unnecessary altering of component leads which may result in damage to the component.

In accordance with the present invention, a method of assembling components on printed wiring boards, whereby the components are spaced away from the board, comprises the step of depositing material through apertures in a mask onto the areas in which the components are to be mounted and to a depth effectively equal to the thickness of the desired spacing on the component side of the board. The method further comprises the step of mounting the components on the board so that the components rest against the material and, finally, the step of removing the material after the components have been mounted.

For a better understanding of the present invention, together with other and further objects thereof, reference is had to the following description taken in connection with the accompanying drawing, and its scope will be pointed out in the appended claims.

Figure 2:
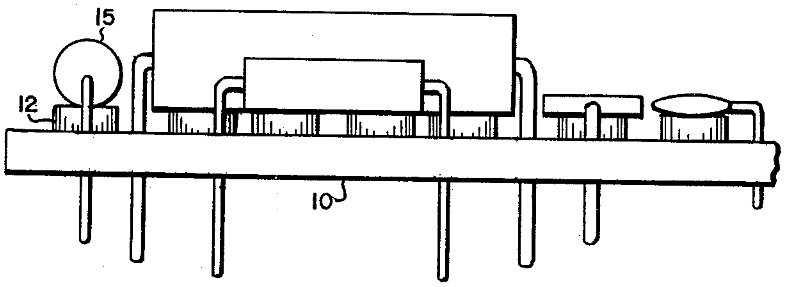

Referring to the drawing:

FIG. 1 of the drawing shows a plan view of a printed wiring board before the components have been mounted, and FIG. 2 shows a side view of a printed wiring board immediately after the components have been mounted.

In a preferred form of the invention, and with reference to FIGS. 1 and 2, the method comprises the step of depositing material on the component side of the printed wiring board 10 in the areas in which the components are to be mounted and to a depth effectively equal to the thickness of the desired spacing. The material used should have the characteristics of being easily dissolved, quick drying, and capable of setting to a sufficient hardness to withstand the pressure of the heaviest component on the board even during the high temperature experienced during the soldering process. Although a number of materials may be available with these desired characteristics, such as high temperature wax or white rosin, a chemical presently proved to be very useful and, therefore, discussed herein is sodium silicate (waterglass), ortho, soluble granular. It is mixed with ordinary tap water to the consistency of a paste which should be such as to be thin enough to allow the paste to be worked with a brush or spatula while at the same time be thick enough to retain its shape immediately after being deposited on the board. Using the sodium silicate, a paste of proper consistency may be obtained by mixing approximately seven parts of the silicate with three parts of water. As used in this text, the phrase "depositing material" means placing the material onto the board so that the material adheres thereto without the use of external holding means. "Effectively equal" to the thickness of desired spacing means that if a paste material is used which has a tendency to shrink when setting, allowance for this shrinkage should be made by depositing enough paste on the board so that, after setting, the thickness of the paste is equal to the desired spacing.

While the paste may be deposited directly on the board with a brush or similar means it may be preferable to place a mask 11 of a thickness effectively equal to the desired spacing over the board with suitably located apertures 13, 13 in the mask 11 and then to use a spatula to force the paste onto the board through the apertures. This has a two-fold advantage, first, the paste deposits 12, 12 are kept away from the circuit holes 14, 14 and second, the depth of the deposits may be accurately controlled by merely leveling off the paste to the surface of the mask. In this case, the thickness of the mask is determined by whether or not the paste used has a tendency to shrink on setting. Two apertures in the mask may be used for each component 15 thereby having two deposits of material under each component. In this way should one deposit become jarred loose from the board 10 during handling, then the other deposit would still remain to keep the component spaced away from the board 10. After the paste is deposited on the board 10 the mask 11 is then removed. In the case where speed is essential it may be desirable to hasten the drying process by exposing the deposits 12, 12 to raised temperatures. For the sodium silicate paste a temperature of 150° F. for approximately one-half hour is sufficient.

The method also comprises the step of mounting the components on the board so that each component rests against the deposit. This is to assure uniform spacing of the components from the board. Where a paste is used, it should be allowed to dry sufficiently to support the components during the soldering process. The term "mounted" includes both the inserting of the component leads in their respective circuit holes and the soldering of the leads to the holes. The insertion may be accomplished manually or automatically by a machine designed for that purpose. Similarly, the soldering of the leads may be individually done using a soldering iron or simultaneously by using the more conventional dip soldering process.

The method finally comprises the step of removing the material from between the components and the board after the mounting step has been completed. In the case where a water soluble paste is used, such as sodium silicate, the step may include the dissolving and washing off of the hardened paste by flushing the board with warm water. This may be done by immersing the printed wiring assembly in a container of circulating water.

It can be seen that when this method of assembly is used the possibility of damage to the components is substantially reduced since it is no longer necessary to crimp or stake the leads. The material may alternatively be deposited by spraying it on the board through the mask apertures in which case more water would be used in mixing the material to enable the sprayer to pass the mixture. An alternative to the depositing of a paste material is to place small phenolic spacers of the appropriate thickness on the board. They may then be held thereto by a soluble paste. When the mounting step is completed the paste would then be dissolved thereby freeing the small phenolic spacers from the board.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

A method of assembling components on printed wiring boards whereby the components are spaced away from the board, comprising: the step of depositing material through apertures in a mask onto the areas in which the components are to be mounted and to a depth effectively equal to the thickness of the desired spacing on the component side of the board; the step of mounting the components on the board so that the components rest against said material; and the step of removing said material after the components have been mounted.

References Cited in the file of this patent

UNITED STATES PATENTS

| | | |
|---|---|---|
| 1,486,586 | Jones | Mar. 11, 1924 |
| 2,752,664 | Brown | July 3, 1956 |
| 2,756,485 | Abramson et al. | July 31, 1956 |